(12) United States Patent
Labbe et al.

(10) Patent No.: US 11,994,538 B2
(45) Date of Patent: May 28, 2024

(54) CURRENT TRANSDUCER WITH MAGNETIC CORE ON PRIMARY CONDUCTOR BAR

(71) Applicant: LEM INTERNATIONAL SA, Meyrin (CH)

(72) Inventors: Arnaud Labbe, St Girod (FR); Gérard Lepine, Peillonnex (FR)

(73) Assignee: LEM INTERNATIONAL SA, Plan-les-Ouates (CH)

( * ) Notice: Subject to any disclaimer, the term of this patent is extended or adjusted under 35 U.S.C. 154(b) by 269 days.

(21) Appl. No.: 17/442,453

(22) PCT Filed: Mar. 24, 2020

(86) PCT No.: PCT/EP2020/058067
§ 371 (c)(1),
(2) Date: Sep. 23, 2021

(87) PCT Pub. No.: WO2020/193501
PCT Pub. Date: Oct. 1, 2020

(65) Prior Publication Data
US 2022/0163569 A1 May 26, 2022

(30) Foreign Application Priority Data

Mar. 28, 2019 (EP) .................................... 19166021

(51) Int. Cl.
*G01R 15/20* (2006.01)
*G01R 19/00* (2006.01)
*H01F 38/30* (2006.01)

(52) U.S. Cl.
CPC ....... *G01R 15/202* (2013.01); *G01R 19/0092* (2013.01)

(58) Field of Classification Search
CPC .............. G01R 19/0092; G01R 15/185; G01R 15/202; G01R 15/205; H01F 38/30
See application file for complete search history.

(56) References Cited

U.S. PATENT DOCUMENTS

| 4,749,940 A | 6/1988 | Bullock |
| 6,781,359 B2 | 8/2004 | Stauth |

(Continued)

FOREIGN PATENT DOCUMENTS

CN 104067447 9/2014

OTHER PUBLICATIONS

International Search Report and Written Opinion issued by the International Searching Authority, dated May 7, 2020, for International Patent Application No. PCT/EP2020/058067; 13 pages.

*Primary Examiner* — Jermele M Hollington
*Assistant Examiner* — Temilade S Rhodes-Vivour
(74) *Attorney, Agent, or Firm* — Faegre Drinker Biddle & Reath LLP (57) ABSTRACT

An open loop electrical current transducer including a primary conductor bar, for carrying a current to be measured, a magnetic core having a U shape formed by an end branch and lateral branches upstanding therefrom to free ends, a magnetic circuit gap formed between inner surfaces of the lateral branches at the free ends of the lateral branches, a magnetic field detector positioned in the magnetic circuit gap, and a housing surrounding the magnetic core and a section of the primary conductor bar extending through the magnetic core and beyond the magnetic core either side thereof. The primary conductor bar includes a central portion having a width (Wc) equal to the width of a magnetic field gap (Wg) such that the central portion is clamped between said lateral branches in an interference force fit.

22 Claims, 6 Drawing Sheets

(56) References Cited

U.S. PATENT DOCUMENTS

| | | | |
|---|---|---|---|
| 2004/0056647 A1 | 3/2004 | Stauth | |
| 2004/0155644 A1* | 8/2004 | Stauth .................. | G01R 15/207 |
| | | | 324/117 R |
| 2010/0090684 A1* | 4/2010 | Chen .................... | G01R 15/202 |
| | | | 324/117 H |
| 2014/0091788 A1 | 4/2014 | Misaki | |
| 2015/0253412 A1* | 9/2015 | Jost ........................ | G01R 35/00 |
| | | | 324/202 |
| 2016/0327593 A1* | 11/2016 | Labbe .................. | G01R 15/183 |
| 2018/0321282 A1 | 11/2018 | Hurwitz | |

* cited by examiner

FIG 3

CURRENT TRANSDUCER WITH MAGNETIC CORE ON PRIMARY CONDUCTOR BAR

CROSS-REFERENCE TO RELATED APPLICATIONS

The present application is a national stage entry of International (PCT) Patent Application Number PCT/EP2020/058067, filed Mar. 24, 2020, which in turn claims priority to European Patent Application No. 19166021.6, filed Mar. 28, 2019, the subject matter of which are expressly incorporated herein by reference.

The present invention relates to an electric current transducer comprising a magnetic core and a magnetic field detector in an air-gap of the magnetic core, for measuring an electrical current flowing in a primary conductor.

Electrical current sensors are used in a large variety of applications for monitoring or controlling electrical devices and system and in many applications there is an important advantage in reducing the size of the sensor as well as the manufacturing cost.

Many open loop current transducers comprise a magnetic core configured to surround a primary conductor through which a current to be measured flows, the magnetic core having an air gap in which a magnetic field detector is positioned to measure a portion of the magnetic flux circulating in the magnetic core due to the magnetic field generated by the primary conductor. The magnetic field detector is very often a Hall effect detector that is typically provided in the form of an application specific integrated circuit (ASIC) with terminals for connection to a circuit board. The circuit board either interconnects the magnetic field detector to a connector of the transducer for connection to an external circuit, or presents terminals for connection to an external circuit board on which the transducer is mounted.

In certain applications, a primary conductor bar is directly integrated in the current transducer and presents connection ends for coupling to a conductor in which the current to be measured flows. Such primary conductor bar may be essentially in a form of a rigid metallic bar with connection ends configured according to the application and implementation of the current transducer in an electrical system. The magnetic core, magnetic field detector, and primary conductor are often assembled in an electrically insulated housing that may be mounted as a separate component to which the magnetic core, primary conductor, magnetic field detector and other components such as a conductor and circuit board are assembled. In some applications, the inside of the insulated housing may be filled with a potting material that provides better insulation and stability to the various components assembled within the housing. The primary conductor bar is typically either overmolded by a plastic housing, around which the magnetic core is mounted, or inserted in a cavity of the insulating housing within which the magnetic core is assembled or overmolded.

Such open loop current transducers are very economical but are quite voluminous and limits their use in applications in which space is confined. There are many other current transducers that do not use magnetic cores or that are of the closed loop type that may be implemented to satisfy limited space requirements, however such current transducers are typically more costly to manufacture and use than open loop current transducer of the aforementioned type.

An object of this invention is to provide an economical open loop current transducer that is compact and reliable.

It is advantageous to provide a current transducer that is cost effective to assemble.

It is advantageous to provide an electrical current transducer that is robust and that can be implemented in a harsh environment.

Objects of the invention have been achieved by providing a current transducer according to claim 1.

Objects of the invention have been achieved by providing a current transducer according to claim 12.

Disclosed herein is an open loop electrical current transducer comprising a primary conductor bar for carrying a current to be measured, a magnetic core having a U shape formed by an end branch and lateral branches upstanding therefrom to free ends, a magnetic circuit gap formed between inner surfaces of the lateral branches at the free ends of the lateral branches, a magnetic field detector positioned in the magnetic circuit gap, and a housing surrounding the magnetic core and a section of the primary conductor bar extending through the magnetic core.

According to a first aspect of the invention, the primary conductor bar comprises a central portion having a width equal to the width of a magnetic field gap configured such that the central portion is clamped with a non-null clamping force between said lateral branches in an interference force fit. In order to obtain an interference force fit there must be some material deformation, inherently including some elastic deformation in such manner that there is a clamping effect. This implies that the width of a magnetic field gap is slightly less than the width of the central portion prior to assembly thus requiring a forced insertion that generates stresses and provides the clamping effect therebetween.

According to a second aspect of the invention, the conductor primary conductor bar central portion comprises a base layer and one or more folded over conductor layers with a total width equal to the width of the airgap in the core.

The folded over conductor layers may advantageously be formed from a tongue integrally formed with and extending laterally from an edge of the primary conductor bar, the folding over direction being orthogonal to the direction of flow of the primary current through the airgap In an advantageous embodiment, the lateral branches of the magnetic core are substantially parallel to each other.

In an embodiment, the primary conductor bar central portion has a width less that a width of the section of primary conductor bar positioned either side of the magnetic core, the central portion formed by a pair of indents from opposing outer edges of the primary conductor bar, wherein each indent receives therein a lateral branch of the magnetic core in a close fit.

In an advantageous embodiment, a length of the indents in a direction of flow of the primary current, is essentially equivalent to a length of the magnetic core.

In an advantageous embodiment, a width of each lateral branch is equivalent to a width of the indents +/−20%.

In an advantageous embodiment, the cross-section of a portion of primary conductor bar mounted within the housing has an essentially flat rectangular shape.

In an advantageous embodiment, the housing comprises a base comprising a magnetic field detector lodging portion inserted within the magnetic circuit gap and comprising a slot receiving the magnetic field detector therein such that the magnetic field detector is held within the magnetic circuit gap, separated from the lateral branches of the magnetic core by an insulating layer.

In an advantageous embodiment, the housing base comprises a magnetic field sensing unit lodging portion allowing translational insertion of the magnetic field sensing unit in the housing base, the housing further comprising a cover mounted over the magnetic field sensing unit lodging portion.

In an advantageous embodiment, the current transducer comprises a connector, the connector comprising a shroud integrally formed with the housing base and comprising terminals overmolded by the housing base and having connection portions connecting to the circuit board of the magnetic field sensing unit.

In an advantageous embodiment, the central portion has a rectangular cross-section and the magnetic core inner surface in close fit around the central portion also has a rectangular shape.

Further objects and advantageous features of the invention will be apparent from the claims, from the detailed description, and annexed drawings, in which:

FIG. 5a is a perspective view of components of a current transducer according to an embodiment of the invention with the housing removed, illustrating a magnetic core and magnetic field detector mounted around a primary conductor;

FIG. 5b is a perspective view of a magnetic core of the embodiment of FIG. 5a;

FIG. 5c is a perspective view of a primary conductor bar of the embodiment of FIG. 5a;

FIG. 9a is a perspective partial sectional view of a current transducer according to another embodiment of this invention;

FIG. 9b is a perspective view of portions of the embodiment of FIG. 9a with the housing removed and FIG. 9c is a perspective view of the primary conductor bar of the embodiment of FIG. 9a;

FIG. 10a is a perspective partial sectional view of a current transducer according to another embodiment of this invention;

FIG. 10b is a perspective view of portions of the embodiment of FIG. 10a with the housing removed and FIG. 10c is a perspective view of the primary conductor bar of the embodiment of FIG. 10a.

Referring to the figures, an electrical current transducer 2 according to embodiments of the invention comprises a magnetic core 6, a magnetic field detector 8, and a primary conductor 4, 104, 104' for carrying a primary current to be measured by the electrical current transducer 2.

The magnetic core 6 has a general U shape comprising an end branch 6a and lateral branches 6b extending from ends of the end branch 6a to respective free ends. In a preferred embodiment, the lateral branches 6b are substantially parallel to each other. In a preferred embodiment, the lateral branches are substantially orthogonal to the end branch 6a.

The magnetic field detector 8 may be in the form of an application specific integrated circuit (ASIC) comprising a Hall effect detector packaged within an insulating housing and presenting electrical terminals 21 for connection to a circuit board or flexible circuit substrate with conductive traces thereon. Such magnetic field detectors are per se well known and need not be further described herein. Other magnetic field detectors may be used instead of a Hall effect detector, for instance fluxgate detectors or magneto-resistive magnetic field detectors.

A magnetic field detector 8 may be interconnected to a circuit board or flexible circuit 20 by its terminals 21 to form a magnetic field sensing unit 7.

Figure 1A:
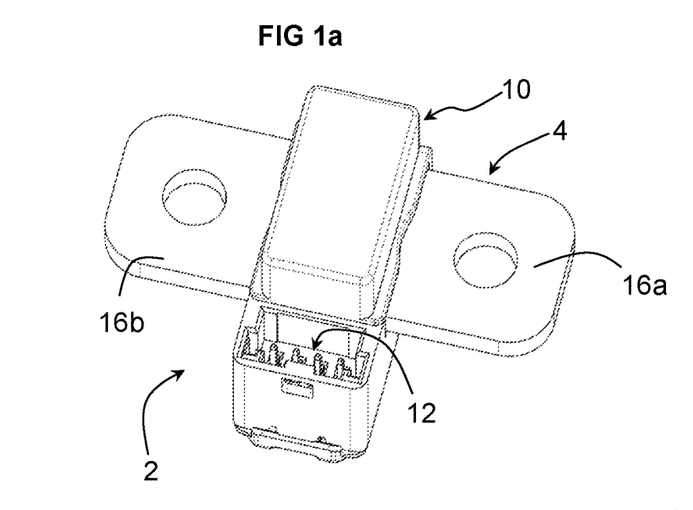
FIGS. 1a and 1b are perspective views of a current transducer according to an embodiment of this invention.
Figure 1B:
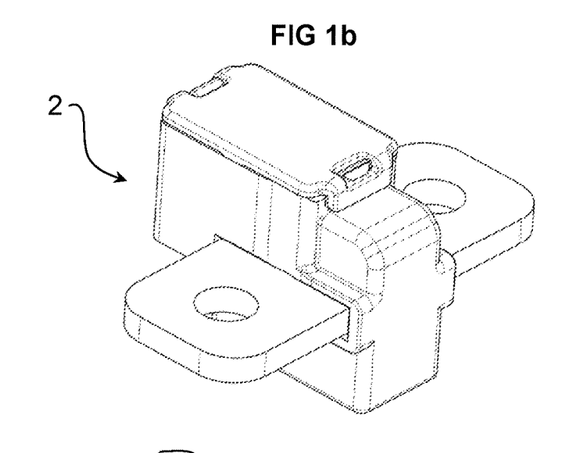
Figure 2:
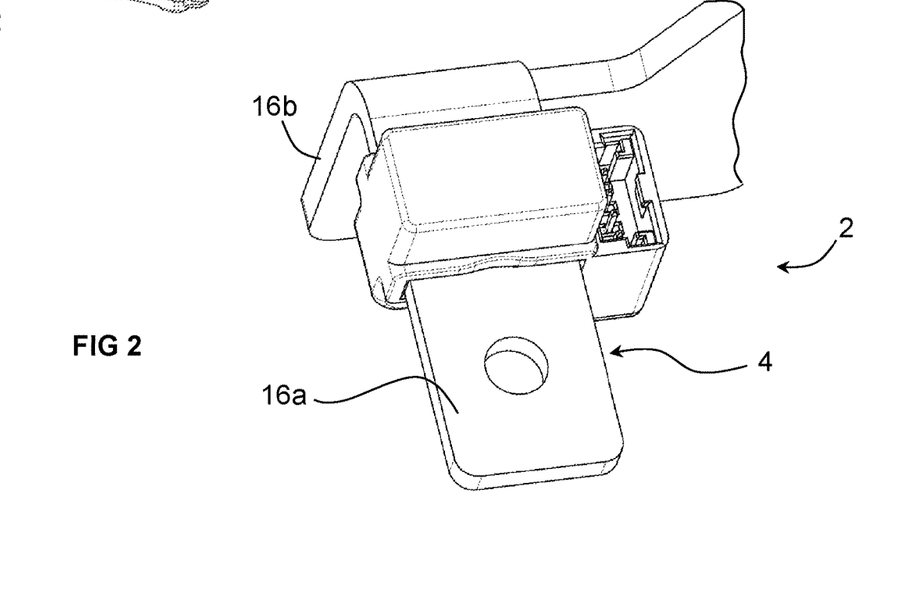
FIG. 2 is a perspective view of a current transducer according to another embodiment of the invention.
Figure 3:
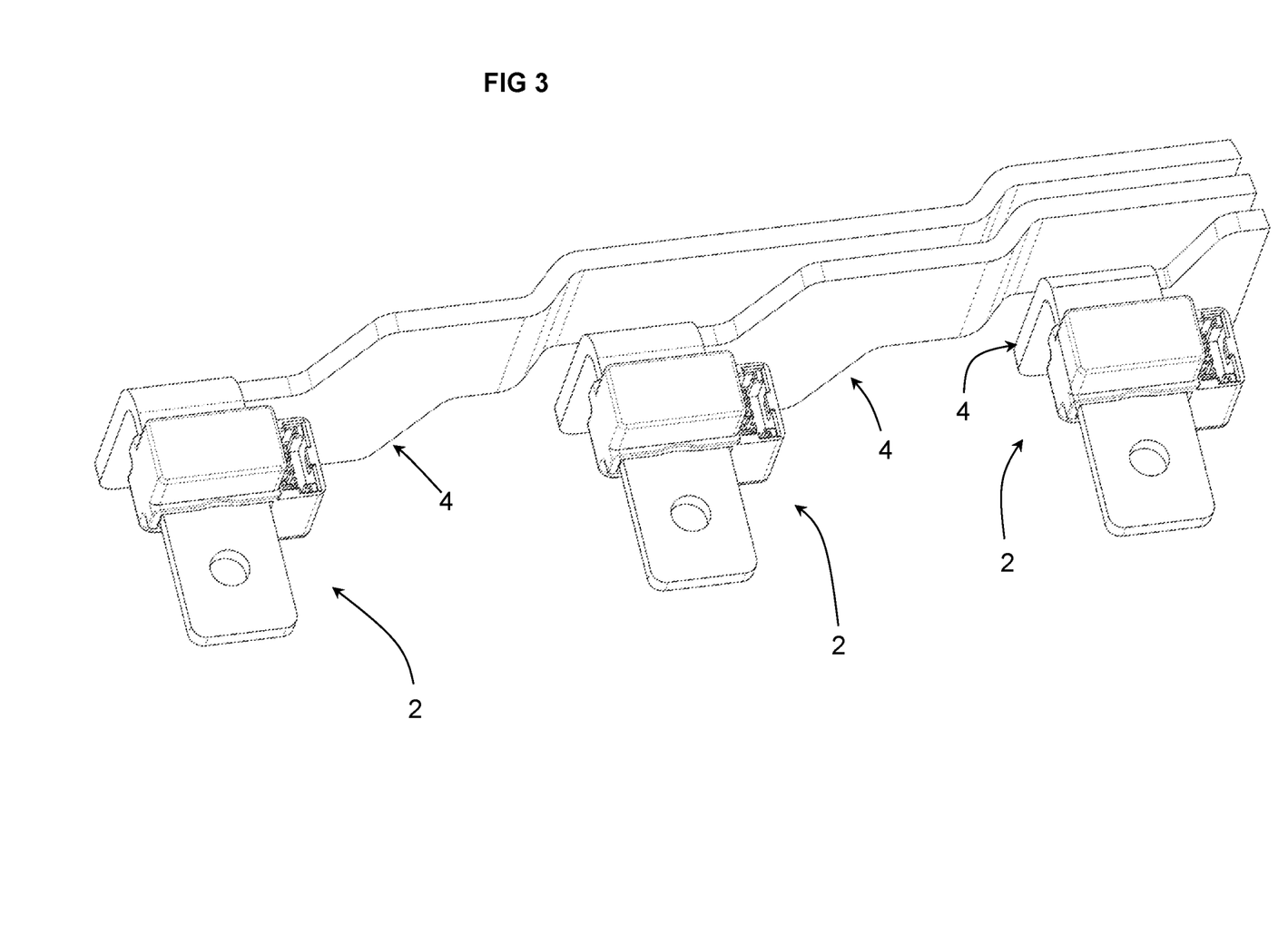
FIG. 3 is a perspective view of a plurality of current transducers according to an embodiment of the invention.
Figure 4:
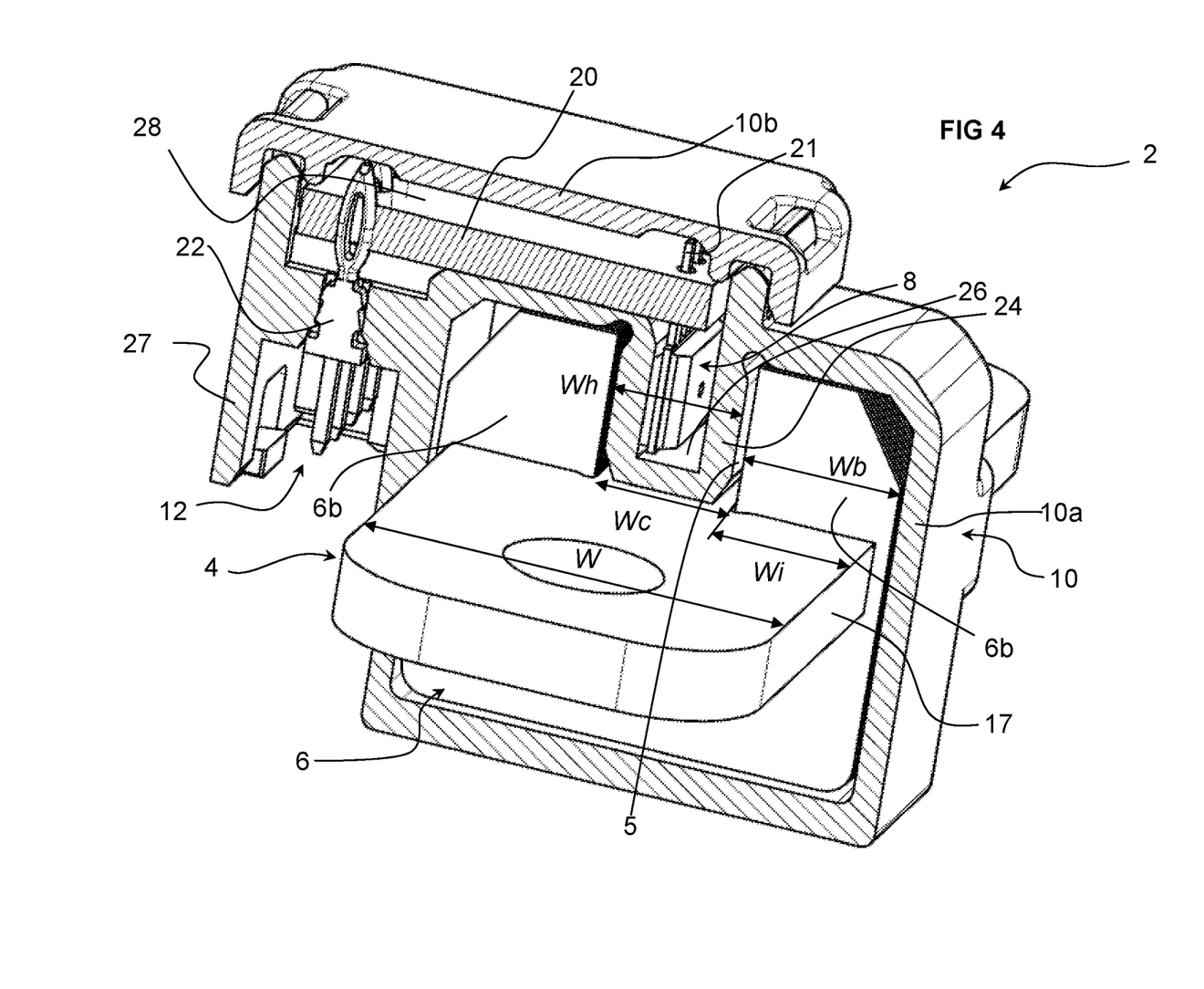
FIG. 4 is a perspective cross sectional view of a current transducer according to an embodiment of the invention.
Figures 5A, 5B, 5C:
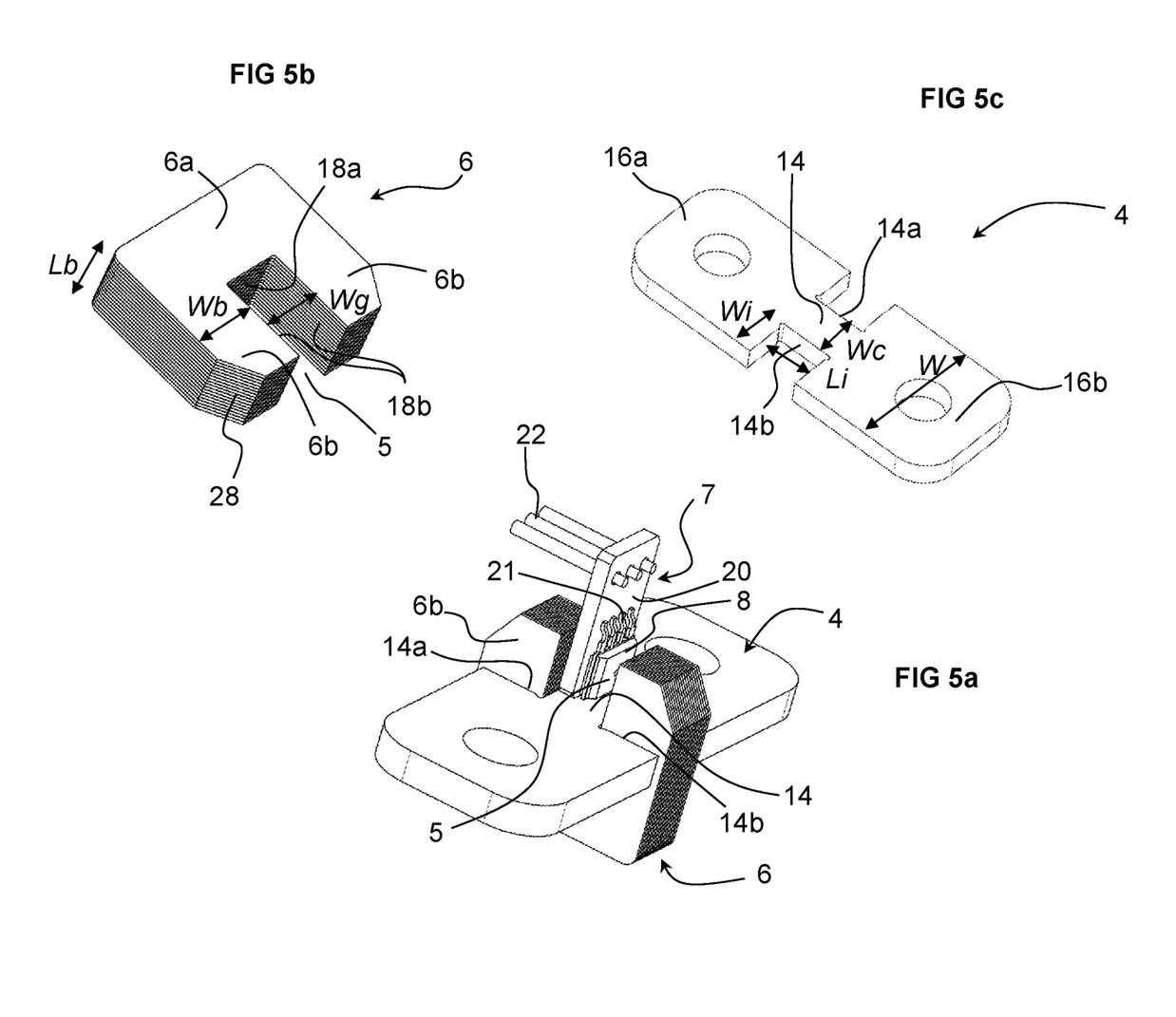
Figure 6:
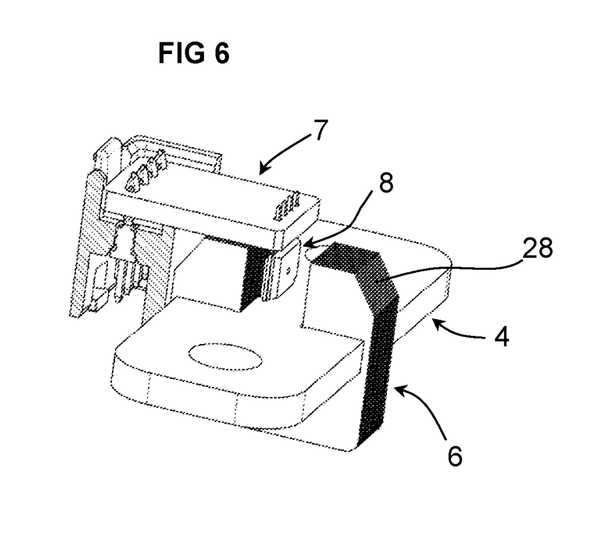
FIGS. 6 to 8 are perspective views similar to FIG. 5a, of variants.
Figure 7:
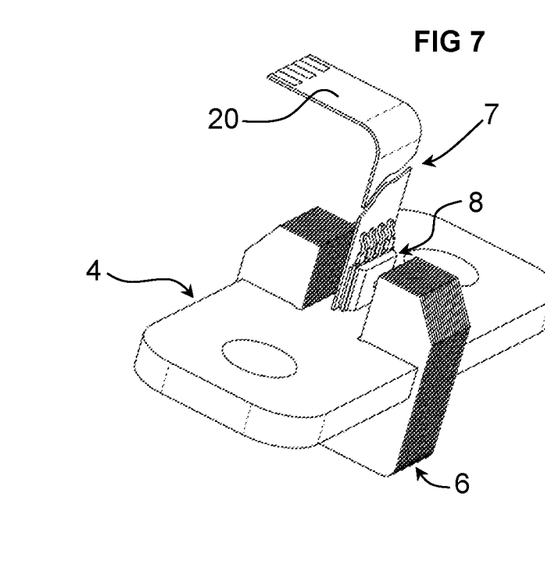

In the embodiment illustrated in FIG. 4, the magnetic field sensing unit comprises a rigid circuit board 20 to which the magnetic field detector 8 is connected, the circuit board extending to a connector portion to which terminals 22 of a connector 12 are mounted. The connector 12 enables the current transducer to be connected via a pluggable connector to an external circuit. The connector 12 may however present other forms, for instance having electrical terminals for connection to an external circuit board for instance by soldering or welding. Such connection systems between current transducers and external circuits are per se well known.

The magnetic field detector 8 is positioned in a magnetic circuit gap 5 (often called an "air gap", even though the gap is not necessarily filled with air) formed between the free ends of the lateral branches 6b of the magnetic core 6. Each lateral branch 6b presents an essentially planar inner surface 18b extending from the end branch 6a to form the air gap 5.

The primary conductor bar 4, 104, 104' may typically be made of an extruded and or stamped and formed of a metallic material, such as copper alloy, that is substantially rigid and self-supporting.

In embodiments illustrated in FIGS. 1-8, the primary conductor bar comprises a central portion 14 formed by indents 14a, 14b extending into the primary conductor bar from outer edges 17 that define the width W of the primary conductor bar extending from the magnetic core 6. The central portion 14 thus has a smaller width Wc than the primary conductor has on either side of the magnetic core 6, the width Wc of the central portion 14 being substantially equivalent to the gap 5 between the inner surfaces 18b between lateral branches 6b of the magnetic core in order to allow the central portion 14 to be inserted between lateral branches in a close fit. The depth Wi of the indents 14a, 14b may be substantially equivalent to the width Wb of a lateral branch 6a, 6b, or in the range of plus or minus 20% of the width of the lateral branch (Wi=Wb+/−0.2×Wb) such that the width W of the primary conductor bar 4 and the magnetic core 6 are substantially equivalent in the range of 20%. The width of the current transducer around the magnetic core and the portions of the primary conductor extending from the magnetic core may thus be quite compact without substantially reducing the width W of the connection portions 16a, 16b of the primary conductor which allow to be coupled to a conductor carrying a current to be measured.

The length Li of the indent 14a, 14b in the primary conductor bar 4 may correspond essentially to the length (thickness) Lb of the magnetic core branches 6b inserted therebetween, such that the length of the central portion 14 (seen in the direction of flow of the primary current) is limited to the thickness Lb of the magnetic core. This reduces the resistance to electrical current formed by the reduced section of the central portion by minimizing its length in the direction of current flow.

The term "width" as used herein defines a distance measured in a direction generally orthogonal to the direction of flow of a primary current to be measured in the central portion of the conductor bar, and the term "length" as used herein defines a distance measured in a direction generally parallel to the direction of flow of the primary current to be measured in the central portion of the conductor bar.

The magnetic core in preferred embodiments may comprise a substantially rectangular inner shape formed by the inner surface 18b of the lateral branches 6b and the inner surface 18a of the end branch 6a, whereby the central portion 14 of the primary conductor bar 4 comprises a rectangular cross-section and may be inserted in a close matching fit with the inner wall 18a and portion of walls 18b upstanding therefrom, the remaining height of the lateral branches serving to form the air gap 5 therebetween in which the magnetic field detector 8 is inserted. Thus, in an embodiment the primary conductor central portion 14 may be fitted slidably between the lateral branches of the magnetic core in direct contact therewith such that the magnetic flux generated by the primary conductor and in particular the central portion 14 thereof is efficiently captured by the magnetic core 6. This reduces the section required by the magnetic core 6 compared to conventional solutions in which an insulating material is positioned between the magnetic core and the primary conductor.

The close fit of the magnetic core 6 around the central portion 14 of the primary conductor bar 4 advantageously reduces magnetic field fringe flux that allows to optimize and reduce the section of the magnetic core and thus reduce its size. The three branches 6a, 6b of the magnetic core 6 formed in a simple U shape is also cost effective to manufacture and very easy to assemble to the primary conductor bar 4 by a translation of the primary conductor bar into the magnetic core.

In an advantageous embodiment, the primary conductor central portion 14 is fitted between the lateral branches of the magnetic core in an interference force fit. In the aforementioned interference force fit, the width Wg of the airgap between branches 6b is slightly less than the width or thickness Wc of the primary conductor central portion 14, 114, 114' prior to assembly such that some elastic and/or plastic deformation of the primary conductor and/or the magnetic core occurs during assembly of the primary conductor to the magnetic core.

Figures 9A, 9B, 9C, 10A, 10B, 10C:
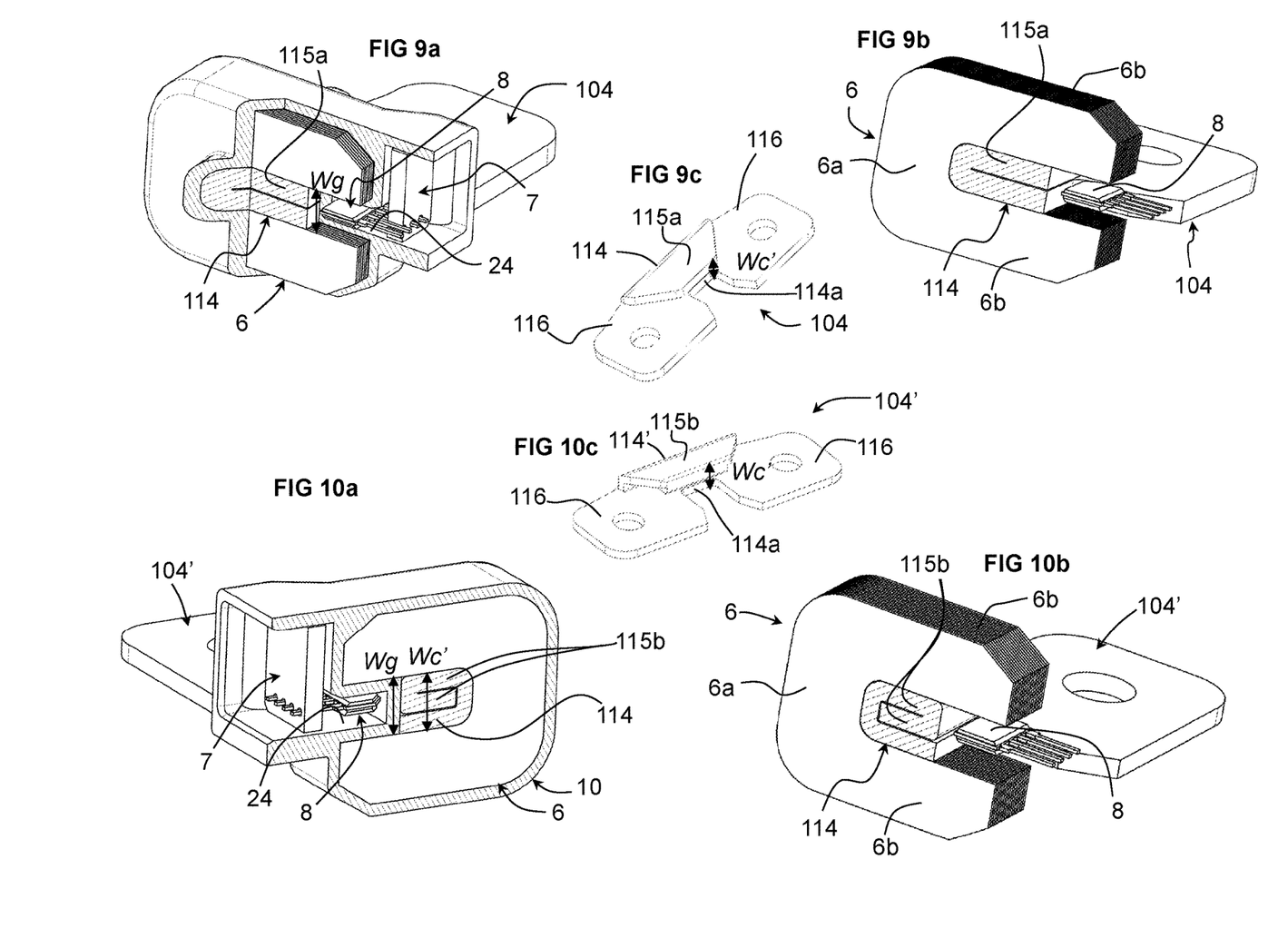

As best seen in FIGS. 4, 9a and 10a, the housing 10 surrounds and receives therein the magnetic core 6 and a portion of the primary conductor bar positioned either side of the magnetic core.

The housing may be a separately formed insulating housing mounted around the magnetic core and primary conductor central portion, or in an advantageous embodiment may be overmolded around the magnetic core and primary conductor central portion.

In an advantageous embodiment, the housing may comprise a magnetic field detector lodging portion 24 that provides an insulation layer between the primary conductor bar central portion 14, 114, 114' and the magnetic field detector 8 as well as between the lateral branches 6b of the magnetic core and magnetic field detector 8. The magnetic field detector lodging portion 24 comprises a slot 26 within which the magnetic field detector 8 is received and positioned.

The magnetic field detector lodging portion 24 may have a width Wh that is substantially equivalent or slightly smaller than the air gap with Wg to provide a snug or close fit within the air gap and to stably position the magnetic field detector within the air gap.

The housing 10 may further comprise a portion forming a connector shroud 27 surrounding the terminals 22 of the connector 12. The housing also has a magnetic field sensor lodging portions 24, 28.

In the illustrated embodiments, the base 10a advantageously comprises the magnetic field detector lodging portion 24 as well as the connector shroud portion 27 and may be formed by overmolding around the magnetic core 6 mounted on the central portion 14, 114, 114' of the primary conductor bar 4, 104, 104'.

In an alternative embodiment, as illustrated in FIG. 4, the housing base 10a may be formed of two parts assembled around the magnetic core and primary conductor bar instead of being overmolded. The magnetic field sensing unit 7 comprising the magnetic field detector 8 and the circuit board 20 may be mounted to the base 10a by inserting the magnetic field detector 8 in the slot 26 and connecting the circuit board 20 to the terminals 22 of the connector 12, thereafter assembling the cover 10b to the base 10a to cover the magnetic field sensing unit 7.

A particularly cost effective manufacturing of the current transducer is thus provided by the above-described configuration.

The magnetic core 6 is advantageously made of a stack of sheets of soft magnetic material as per se well known in the art of magnetic cores, as illustrated in FIGS. 6, 7 and 9a-10c. The aforementioned laminated structure of soft magnetic material has a certain compliance that allows the central portion 14, 114, 114' of the primary conductor bar 4, 104 to be inserted in an interference force fit through the magnetic circuit gap between the lateral branches 6b for a secure tight fit assembly of the primary conductor to the magnetic core. The latter ensures that the magnetic core and primary conductor may be fixed together in a rigid and accurate positional arrangement in a simple assembly operation, and then subsequently mounting in an insulating housing 10 or overmolded with an insulating housing as best seen in FIGS. 9a and 10a.

Figure 8:
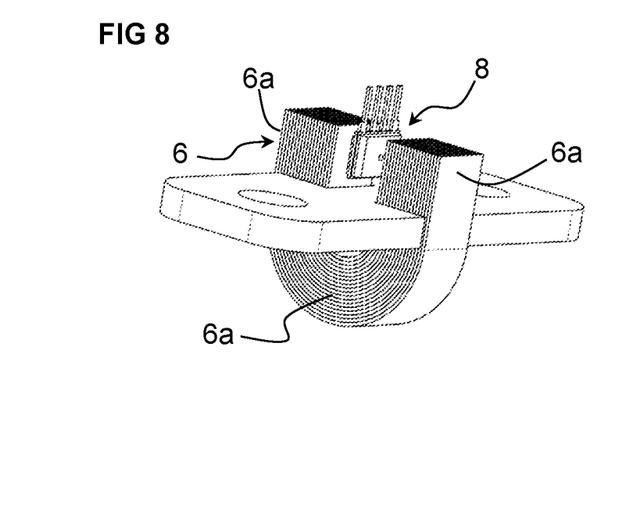

In a variant as illustrated in FIG. 8, the U shaped magnetic core is formed by stacked laminated sheets of soft magnetic material that are stacked in a direction parallel to the direction of the magnetic field gap.

In the embodiment of FIGS. 9a to 10c, the primary conductor central portion 114, 114' comprises one or more folded over conductor layers 115a, 115b with a total width (thickness) Wc' that allows to adjust for the width Wg of the airgap in the core. The adjustment may either be due to use of primary conductor bars with different material thicknesses, or due to the use of magnetic cores with different width airgaps. The folded over conductor layers 115a, 115b, may be formed from a tongue integrally formed with and extending laterally from an edge of the primary conductor bar 104, 104', the folding over direction being orthogonal to the direction of flow of the primary current through the airgap. In the variant illustrated in FIGS. 9a-10c, there is a single folded over layer 115a whereas in the variant illustrated in FIGS. 10a-10c there are two folded over layers 115b.

In the embodiments of FIGS. 9a-10c, the indent 114a in the central portion 114 of the primary conductor bar 104, 104' serves to receive therein the magnetic field detector 8.

The interference force fit insertion of the primary conductor bar central portion 114, 114' between the core branches 6be ensures a stable clamping of the folded over layers and secure tight fit assembly of the magnetic core and primary conductor bar.

Advantageously, the open loop current transducer according to the invention is particularly compact while also being easy to assemble, and therefore provides a low cost current transducer that has a large measurement range for its size, yet is robust.

LIST OF REFERENCES USED electric current transducer 2
  primary conductor bar 4
    outer edge 17
    central portion 14
      indents 14a, 14b
    connection ends 16a, 16b
  primary conductor bar 104, 104'
    central portion 114
      indent 114a
      folded over tongue 115
        single fold 115a
      10 double fold 115b
    connection ends 116
  magnetic core 6
    magnetic circuit gap 5
    end branch 6a
      inner surface 18a
    lateral branches 6b
      inner surface 18b
      free end chamfer 28
  magnetic field sensing unit 7
    magnetic field detector 8
      Terminals 21
    circuit board, circuit flex 20
      Terminals 22
  housing 10
    base 10a
      magnetic field sensing unit receiving cavity 23
      magnetic field detector lodging portion 24
        slot 26
      circuit board lodging portion 28
    cover 10b
  connector 12
    terminals 22
    connector shroud 27

The invention claimed is:

1. An open loop electrical current transducer comprising
a primary conductor bar for carrying a current to be measured,
a magnetic core having a U shape formed by an end branch and lateral branches upstanding therefrom to free ends,
a magnetic circuit gap formed between inner surfaces of the lateral branches at the free ends of the lateral branches,
a magnetic field detector positioned in the magnetic circuit gap, and
a housing surrounding the magnetic core and a section of the primary conductor bar extending through the magnetic core and beyond the magnetic core either side thereof, the primary conductor bar comprising a central portion having a width (Wc) equal to the width of a magnetic field gap (Wg) such that the central portion is clamped between said lateral branches in an interference force fit.

2. The current transducer according to claim 1, wherein the primary conductor bar central portion has a width (Wc) less that a width (W) of the section of primary conductor bar positioned either side of the magnetic core, the central portion formed by a pair of indents from opposing outer edges of the primary conductor bar, wherein each indent receives therein a lateral branch of the magnetic core in a close fit.

3. The current transducer according to claim 2, wherein a length (Li) of the indents in a direction of flow of the primary current, is essentially equal to a length (Lb) of the magnetic core.

4. The current transducer according to claim 2, wherein a width (Wb) of each lateral branch is equal to a width (Wi) of the indents +/−20%.

5. The current transducer according to claim 1, wherein the cross-section of a portion of primary conductor bar mounted within the housing has an essentially flat rectangular shape.

6. The current transducer according to claim 1, wherein the housing comprises a base comprising a magnetic field detector lodging portion inserted within the magnetic circuit gap and comprising a slot receiving the magnetic field detector therein such that the magnetic field detector is held within the magnetic circuit gap, separated from the lateral branches of the magnetic core by an insulating layer.

7. The current transducer according to claim 1, wherein a housing base comprises a magnetic field sensing unit lodging portion allowing translational insertion of the magnetic field sensing unit in the housing base, the housing further comprising a cover mounted over the magnetic field sensing unit lodging portion.

8. The current transducer according to claim 1, wherein the current transducer comprises a connector, the connector comprising a shroud integrally formed with the housing base and comprising terminals overmolded by the housing base and having connection portions connecting to a circuit board of the magnetic field sensing unit.

9. The current transducer according to claim 1, wherein the central portion has a rectangular cross-section and the magnetic core inner surface in close fit around the central portion also has a rectangular shape.

10. The current transducer according to claim 1, wherein the conductor primary conductor bar central portion comprises a base layer and one or more folded over conductor layers with a total width (Wc') that equal to the width (Wg) of the airgap in the core.

11. The current transducer according to claim 10, wherein the folded over conductor layers are formed from a tongue integrally formed with and extending laterally from an edge of the primary conductor bar, the folding over direction being orthogonal to the direction of flow of the primary current through the airgap.

12. An open loop electrical current transducer comprising
a primary conductor bar for carrying a current to be measured,
a magnetic core having a U shape formed by an end branch and lateral branches upstanding therefrom to free ends,
a magnetic circuit gap formed between inner surfaces of the lateral branches at the free ends of the lateral branches,
a magnetic field detector positioned in the magnetic circuit gap, and
a housing surrounding the magnetic core and a section of the primary conductor bar extending through the magnetic core and beyond the magnetic core either side thereof,
wherein a conductor primary conductor bar central portion comprises a base layer and one or more folded over conductor layers with a total width (Wc') equal to the width (Wg) of the airgap in the core.

13. The current transducer of claim 12, wherein the primary conductor bar central portion has a width (Wc) equal to the width of the magnetic circuit gap (Wg) such that the central portion is clamped with a non-null force between said lateral branches in an interference force fit.

14. The current transducer according to claim 12, wherein the primary conductor bar central portion has a width (Wc) less that a width (W) of the section of primary conductor bar positioned either side of the magnetic core, the central portion formed by a pair of indents from opposing outer edges of the primary conductor bar, wherein each indent receives therein a lateral branch of the magnetic core in a close fit.

15. The current transducer according to claim 14, wherein a length (Li) of the indents in a direction of flow of the primary current, is essentially equal to a length (Lb) of the magnetic core.

16. The current transducer according to claim 14, wherein a width (Wb) of each lateral branch is equal to a width (Wi) of the indents +/−20%.

17. The current transducer according to claim 12, wherein the cross-section of a portion of primary conductor bar mounted within the housing has an essentially flat rectangular shape.

18. The current transducer according to claim 12, wherein the housing comprises a base comprising a magnetic field detector lodging portion inserted within the magnetic circuit gap and comprising a slot receiving the magnetic field detector therein such that the magnetic field detector is held within the magnetic circuit gap, separated from the lateral branches of the magnetic core by an insulating layer.

19. The current transducer according to claim 12, wherein a housing base comprises a magnetic field sensing unit lodging portion allowing translational insertion of the magnetic field sensing unit in the housing base, the housing further comprising a cover mounted over the magnetic field sensing unit lodging portion.

20. The current transducer according to claim wherein 12, the current transducer comprises a connector, the connector comprising a shroud integrally formed with the housing base and comprising terminals overmolded by the housing base and having connection portions connecting to a circuit board of the magnetic field sensing unit.

21. The current transducer according to claim 12, wherein the central portion has a rectangular cross-section and the magnetic core inner surface in close fit around the central portion also has a rectangular shape.

22. The current transducer according to claim 12, wherein the folded over conductor layers are formed from a tongue integrally formed with and extending laterally from an edge of the primary conductor bar, the folding over direction being orthogonal to the direction of flow of the primary current through the airgap.

* * * * *